(12) United States Patent
Fang et al.

(10) Patent No.: US 7,456,684 B2
(45) Date of Patent: Nov. 25, 2008

(54) DUAL-CHOPPER AMPLIFIER AND ITS USAGE AS READOUT CIRCUIT FOR CAPACITIVE SENSORS

(75) Inventors: Deyou Fang, Mesa, AZ (US); Huikai Xie, Gainesville, FL (US)

(73) Assignee: University of Florida Research Foundation, Inc., Gainsville, FL (US)

(*) Notice: Subject to any disclaimer, the term of this patent is extended or adjusted under 35 U.S.C. 154(b) by 105 days.

(21) Appl. No.: 11/673,139

(22) Filed: Feb. 9, 2007

(65) Prior Publication Data

US 2008/0191800 A1 Aug. 14, 2008

(51) Int. Cl.
*H03F 1/02* (2006.01)

(52) U.S. Cl. .......................................... 330/9

(58) Field of Classification Search ............ 330/9, 330/51; 327/124, 307
See application file for complete search history.

(56) References Cited

U.S. PATENT DOCUMENTS 6,621,334 B2 * 9/2003 Ausserlechner et al. ......... 330/9
6,788,136 B2 * 9/2004 McGrath ........................ 330/9
7,295,061 B1 * 11/2007 Dasgupta ........................ 330/9

* cited by examiner

*Primary Examiner*—Khanh V Nguyen
(74) *Attorney, Agent, or Firm*—MH2 Technology Law Group LLP

(57) ABSTRACT

Low-noise, high-dynamic-range readout circuits with reduced power dissipation for capacitive sensors having small sensing capacitance and low transducer sensitivity are provided by combining a mixed modulation clock and a dual-chopper amplifier (DCA) circuit. The mixed modulation clock is generated by an exclusive-OR (XOR) of a high frequency clock and a low frequency clock. With the mixed modulation clock, an input signal is double-modulated by the high frequency clock and the low frequency clock, respectively. The DCA amplifies the input signal in two amplification stages. The first amplification stage amplifies the double-modulated signal and then demodulates the amplified signal by the high-frequency clock. Then, the second amplification stage amplifies the signal as a conventional chopper amplifier with the low-frequency clock as the chopping clock. Low pass filters following the two amplification stages filter out the modulated circuit offset and low-frequency flicker noise.

20 Claims, 7 Drawing Sheets

DUAL-CHOPPER AMPLIFIER AND ITS USAGE AS READOUT CIRCUIT FOR CAPACITIVE SENSORS

FIELD

Embodiments relate generally to readout circuits for capacitive sensors. Particularly, embodiments relate to the readout and amplification of small sensed signals in micromachined capacitive sensors having small sensing capacitance and low transducer sensitivity.

BACKGROUND

Today, many sensors such as MEMS accelerometers, gyroscopes and microphones include a capacitive interface circuit. In capacitive sensor readout circuits, full or half capacitive bridges can be formed by sensing capacitors of a sensing element. The capacitive bridges generate a capacitance change in response to a stimulus to be sensed. The capacitance change is converted to a voltage by the readout interface circuit, which is normally implemented as a charge amplifier or voltage amplifier.

Most MEMS capacitive sensors, particularly monolithic MEMS capacitive sensors, have very small sensing capacitance and very low transducer sensitivity. The sensed signals in these sensors typically have a bandwidth from DC to a few kilohertz (kHz). For example, monolithic surface micromachined accelerometers and gyroscopes have a sensing capacitance well below one picofarad (1 pF) and a sensed voltage signal at the sensing element that is in the microvolt ($\mu V$) range or even lower. Large signal gain must be provided by the readout circuits in order to achieve a useful overall sensitivity. Designing readout circuits with high dynamic range and low power dissipation for these capacitive sensors may be challenging since the small value of the sensing capacitance results in high output impedance and the small signals are greatly affected by parasitic capacitances and other non-idealities in the readout circuit. The 1/f noise is a major noise source in the signal frequency range and remains significant even when the electronic noise is minimized for small parasitic capacitance. In sub-micron complementary metal oxide semiconductor (CMOS) technology, a small sensing capacitance of less than 1 pF results in a 1/f noise corner of the readout circuit around one megahertz (1 MHz) or even higher.

To effectively remove the 1/f noise, correlated-double sampling is widely used in switched-capacitor (SC) charge amplifier readout circuits. Additionally, chopper amplifier technique is mostly used in continuous-time voltage (CTV) sensing circuits. By avoiding the kT/C noise and the noise folding effect in SC circuits, CTV circuits typically achieve lower noise than their SC counterparts as long as the chopping clock frequency is chosen at about the flicker noise corner frequency or higher.

In SC and conventional chopper-amplifier based CTV readout circuits, high clock frequency is needed to effectively remove 1/f noise. In addition, low transducer sensitivity generally requires that a large signal gain must be provided by the readout circuits. Together with the high clock frequency, this low sensitivity inevitably results in a high-gain bandwidth requirement of amplifiers in the readout circuits. This severely limits the minimization of the power dissipation of the readout circuits. Most currently available monolithic capacitive sensors with high resolution or high dynamic range normally dissipate a power well above a few milli watts (mWs) or even tens of mWs. This large power level greatly limits their application in portable consumer electronics market.

SUMMARY

An embodiment of the present disclosure is a two-stage dual-chopper amplifier with one modulation chopper and two demodulation choppers. A high-frequency clock and a low-frequency clock are used for the two demodulation choppers respectively. The clock for the modulation chopper is a mixed clock generated by an exclusive-OR (XOR) of the two demodulation clocks. The amplifier comprises an input modulated by the modulation chopper with the mixed clock; a first amplification stage coupled to the modulated input and demodulated by the high-frequency demodulation clock; a second amplification stage coupled to the first amplification stage and demodulated by the low-frequency demodulation clock; and an output coupled to the second amplification stage. Low pass filters are added after the two amplification stages to filter out the modulated circuit offset and modulated low-frequency noise.

Another embodiment is directed to a readout circuit for capacitive sensors. Full or half capacitive bridges are provided by the capacitive sensing element. The sensed signal is modulated by a mixed modulation clock, and is picked up and amplified by a two-stage amplifier with two demodulation choppers. A high-frequency clock and a low-frequency clock are used for the two demodulation choppers respectively. The modulation clock for the capacitive bridge is a mixed clock generated by an exclusive-OR (XOR) of the two demodulation clocks. The two-stage amplifier comprises a first amplification stage coupled to the sensing nodes and demodulated by the high-frequency demodulation clock, and a second amplification stage coupled to the first amplification stage and demodulated by the low-frequency demodulation clock. The readout circuit further comprises an output coupled to the two-stage amplifier. Low pass filters are added after the two amplification stages to filter out the modulated circuit offset and modulated low-frequency noise.

Another embodiment is directed to a method of amplifying a signal. The method comprises receiving a signal modulated by a mixed clock, which is generated by an exclusive-OR (XOR) of a high-frequency clock and a low-frequency clock; amplifying the received signal by a first amplification; demodulating the first amplified signal by the high-frequency demodulation clock; amplifying the demodulated signal again by a second amplification; and demodulating the second amplified signal by the low-frequency demodulation clock.

Additional embodiments will be set forth in part in the description which follows, and in part will be obvious from the description, or may be learned by practice of the embodiments. The embodiments will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments which with the description, serve to explain the principles of the invention.

DETAILED DESCRIPTION

According to embodiments of the present disclosure a dual-chopper amplifier (DCA) reduces noise and power consumption in various amplification applications. The DCA modulates an input signal by a mixed clock, which is generated by an exclusive-OR (XOR) of a high-frequency clock and a low-frequency clock. The DCA amplifies the modulated input signal in two amplification stages. The first amplification stage amplifies the input signal and then demodulates the amplified signal by the high-frequency demodulation clock. Then, the second amplification stage amplifies the signal and demodulates the signal by the low-frequency demodulation clock.

Low pass filters are added after the two amplification stages to filter out the modulated circuit offset and modulated low-frequency noise. The DCA may be used in different types of capacitive sensors with small sensing capacitance and low transducer sensitivity, such as micro-machined accelerometers, gyroscopes and microphones. By utilizing two amplification stages with double modulations and demodulations, electronic noise may be removed from an amplification circuit while maintaining low power consumption and gain accuracy.

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments. These embodiments are described in sufficient detail to enable those skilled in the art to practice the invention and it is to be understood that other embodiments may be utilized and that changes may be made without departing from the scope of this disclosure. The following description is, therefore, merely exemplary.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1:
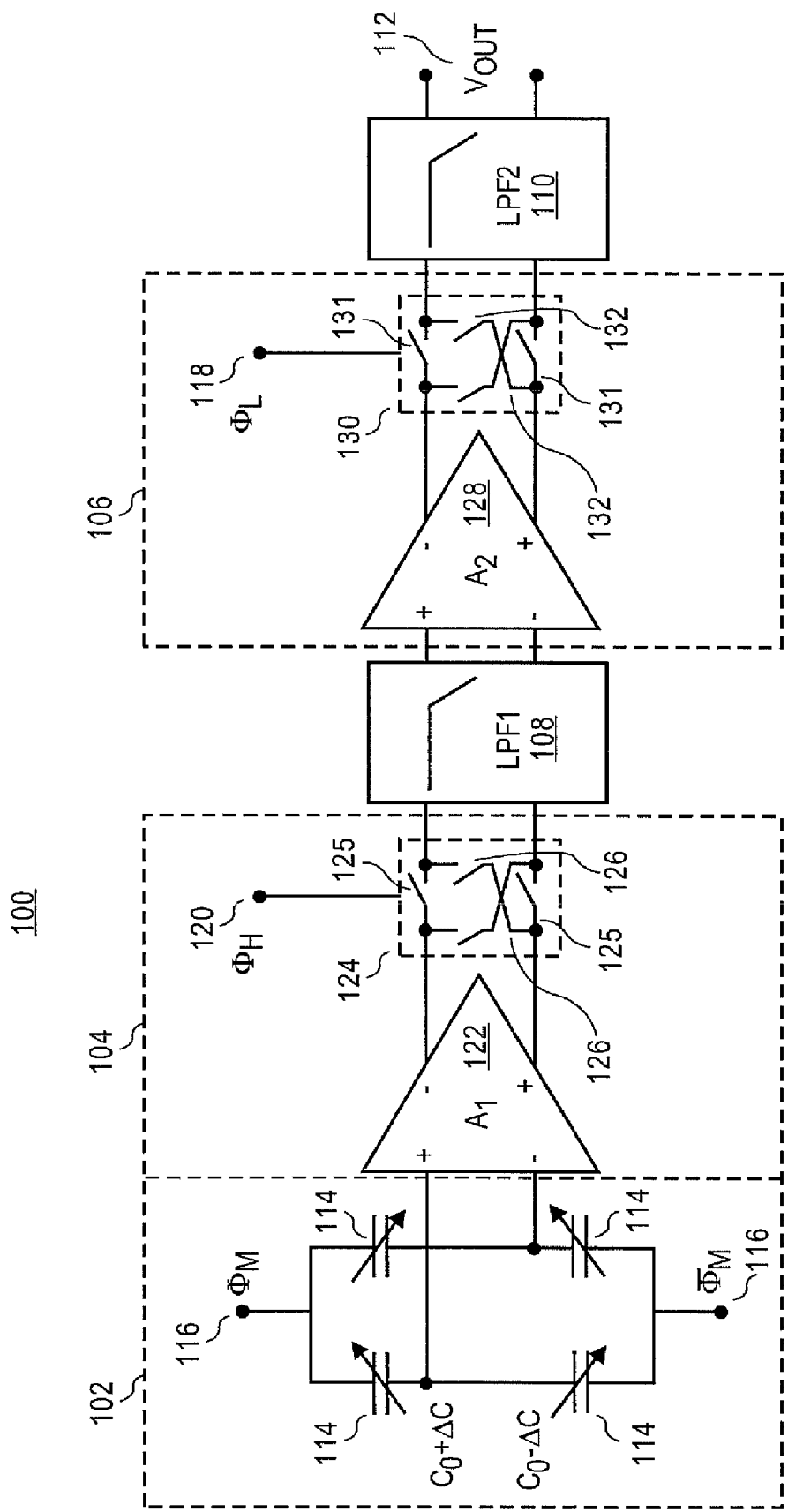
FIG. 1 is a schematic diagram illustrating a dual-chopper amplifier (DCA) consistent with embodiments of the present disclosure.

FIG. 1 is a schematic diagram illustrating a dual chopper amplifier (DCA) 100 consistent with embodiments of the present disclosure. It should be readily apparent to those of ordinary skill in the art that DCA 100 illustrated in FIG. 1 represents a generalized schematic illustration and that other components may be added or existing components may be removed or modified.

As illustrated in FIG. 1, DCA 100 includes an input 102, in which the input signal is modulated with a mixed clock $\Phi_M$ 116, a high-frequency, chopped amplification stage (HFCA) 104, a low-frequency, chopped amplification stage (LFCA) 106, a first low pass filter (LPF1) 108, a second low pass filter (LPF2) 110, and an output 112. DCA 100 may be configured such that input 102, HFCA 104, LFCA 106, LPF1 108, LPF2 110, and output 112 are coupled in series.

DCA 100 may be utilized as a readout circuit for capacitive sensors, such as accelerometers or gyroscopes. As such, input 102 may be any type of electrical circuit capable of generating electrical signals in response to a stimulus to be sensed, such as acceleration or rotation rate. For example, input 102 may be a capacitive bridge for generating a capacitive difference in response to the stimulus. In such an example, input 102 may be formed by mechanical sensing capacitor pairs 114 coupled in parallel. The capacitive bridge generates a voltage signal whose amplitude is proportional to the relative capacitance change $\Delta C/C_0$, where $\Delta C$ is the capacitance change and $C_0$ is the nominal sensing capacitance.

To reduce noise, input 102 may be driven by a modulation clock, $\Phi_M$ 116. Modulation clock $\Phi_M$ 116 may be coupled to both sides of the capacitive bridge. In this configuration, one side of the capacitive bridge is driven by $\Phi_M$ and one side is driven by a complementary clock, $\overline{\Phi}_M$, which is the inverse of $\Phi_M$.

According to embodiments of the disclosure, DCA 100 utilizes two fundamental chopping clocks, a low frequency chopping clock $\Phi_L$ 118 and a high frequency chopping clock $\Phi_H$ 120. The mixed modulation clock $\Phi_M$ 116 is generated by an exclusive disjunction ("exclusive OR" or "XOR") of $\Phi_L$ 118 and $\Phi_H$ 120. The frequencies of $\Phi_L$ 118 and $\Phi_H$ 120, $f_L$ and $f_H$, may be determined by the bandwidth (BW) of the signal from input 102 and the flicker noise corner of amplifier 122, respectively. The frequencies $f_L$ and $f_H$ are required by the relationship $BW \ll f_L \ll f_H$, which are the typical situations for micro-machined capacitive sensors. For instance, MEMS accelerometers may have acceleration signals with a BW of a few kHz, and with $f_L$ being about a few tens of kHz and $f_H$ being about several hundred kHz to several MHz.

After converting the sensed capacitance to a double-modulated voltage signal, DCA 100 amplifies the voltage signal in two stages. DCA 100 may include HFCA 104 and LFCA 106 to amplify the signal modulated by $\Phi_M$ 116. As shown, HFCA 104 may be coupled to input 102 as a first amplification stage. HFCA 104 may comprise an amplifier 122 and a demodulator 124.

Amplifier 122 may be any type of high-bandwidth amplifier capable of amplifying a signal from input 102. For example, amplifier 122 may be an open-loop, high-bandwidth amplifier or a closed-loop, high-bandwidth amplifier optimized to minimize flicker and thermal noise. For instance, amplifier 122 may have a 3-db bandwidth much higher than $f_H$ of $\Phi_H$ 120. As shown in FIG. 1, each input of amplifier 122 may be coupled to a side of the capacitive bridge of input 102. Depending on the configuration of input 102, the DCA 100 and its building blocks can be implemented as fully-differential or single-ended accordingly.

HFCA 104 comprises a demodulator 124 with the high-frequency demodulation clock $\Phi_H$ 120. Demodulator 124 converts the signal amplified by 122 back to be modulated by $\Phi_L$ 118. As shown, $\Phi_H$ 120 may drive demodulator 124 at a frequency $f_H$. Demodulator 124 may be any type of demodulation circuit capable of being driven by a high frequency clock, such as a passive four-switch chopper or an active Gilbert mixer. For example, demodulator may comprise switching pairs 125 and 126 driven by $\Phi_H$ 120 at frequency $f_H$. In this configuration, switches 125 are driven by $\Phi_H$ and switches 126 are driven by a complementary clock, $\overline{\Phi}_H$, which is the inverse of $\Phi_H$.

After HFCA 104, DCA 100 may also include low-pass filter LPF1 108 coupled to the output of HFCA 104. LPF1 108 removes the offset and 1/f noise of amplifier 122, which are modulated to $f_H$ and its odd harmonics by demodulator 124. LPF1 108 may be any type of continuous-time low-pass filter capable of removing high frequency components from the signal from HFCA 104. LPF1 108 is required to have a cutoff frequency $f_{c1}$ such that $f_L<<f_{c1}<f_H$. In applications where $f_H \geq 100 f_L$, LPF1 108 can be removed from DCA 100, because the leakage from offset and 1/f noise of amplifier 122 to the signal band is negligible.

After LPF1 108, DCA 100 may include a second amplification stage LFCA 106 to further amplify the signal from the first amplification stage. As shown, LFCA 106 may be coupled to LPF1 108. LFCA 106 may comprise an amplifier 128 and a demodulator 130 with the low-frequency demodulation clock $\Phi_L$ 118. LFCA 106 operates as a conventional chopper amplifier with $\Phi_L$ 118 as the chopping clock.

Amplifier 128 may be any type of low-bandwidth amplifier capable of amplifying a signal from HFCA 104. For example, amplifier 128 may be a closed-loop, low-bandwidth amplifier optimized to provide accurate gain, consume low power, and maintain a large linear range. For instance, amplifier 128 may have a 3-db bandwidth much higher than $f_L$ of $\Phi_L$ 118.

LFCA 106 also may comprise demodulator 130. Demodulator 130 converts the signal amplified by amplifier 128 back to base-band. As shown, $\Phi_L$ 118 may drive demodulator 130 at a frequency $f_L$. Demodulator 130 may be any type of demodulation circuit capable of being driven by a low frequency clock, such as a passive four-switch chopper or an active Gilbert mixer. For example, demodulator 130 may comprise switching pairs 131 and 132 driven by $\Phi_L$ 118 at frequency $f_L$. In this configuration, switches 131 are driven by $\Phi_L$ and switches 132 are driven by a complementary clock, $\overline{\Phi}_L$, which is the inverse of $\Phi_L$.

After LFCA 106, DCA 100 may also include a low-pass filter LPF2 110 coupled to the output of LFCA 106. LPF2 110 removes the offset and 1/f noise of amplifier 128, which are modulated to $f_L$ and its odd-order harmonics by demodulator 130. LPF2 110 may be any type of continuous-time low-pass filter capable of removing high frequency components from the signal from LFCA 106. LPF2 110 is required to have a cutoff frequency $f_{c2}$ such that $BW<<f_{c2}<f_L$.

DCA 100 may also include output 112 to output the signal amplified by dual amplification stages. For example, if DCA 100 is included in a sensor, output 112 may output the amplified sensed voltage to other components of the sensor or to systems outside the sensor.

Figure 2:
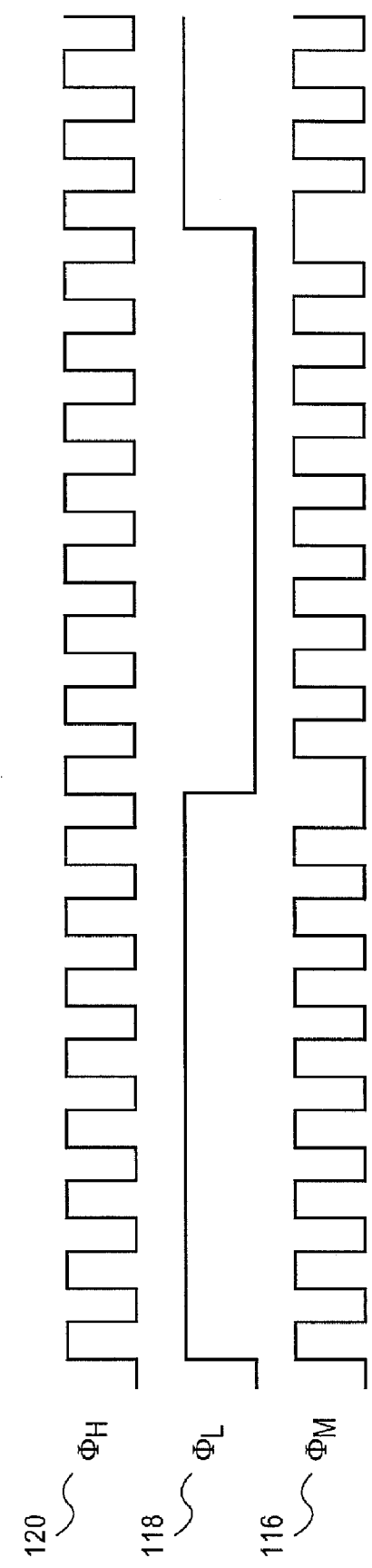
FIG. 2 is a diagram illustrating modulation clocks consistent with embodiments of the present disclosure.

As mentioned above, DCA 100 utilizes two fundamental chopping clocks. FIG. 2 is a diagram illustrating exemplary clock signals $\Phi_M$ 116, $\Phi_L$ 118, and $\Phi_H$ 120. As illustrated in FIG. 2, $\Phi_M$ 116 is generated by an exclusive disjunction ("exclusive OR" or "XOR") of $\Phi_L$ 118 and $\Phi_H$ 120. Clock signals $\Phi_M$ 116, $\Phi_L$ 118, and $\Phi_H$ 120 may be generated by any type of electrical circuit capable of generating a clock signal.

Figure 3:
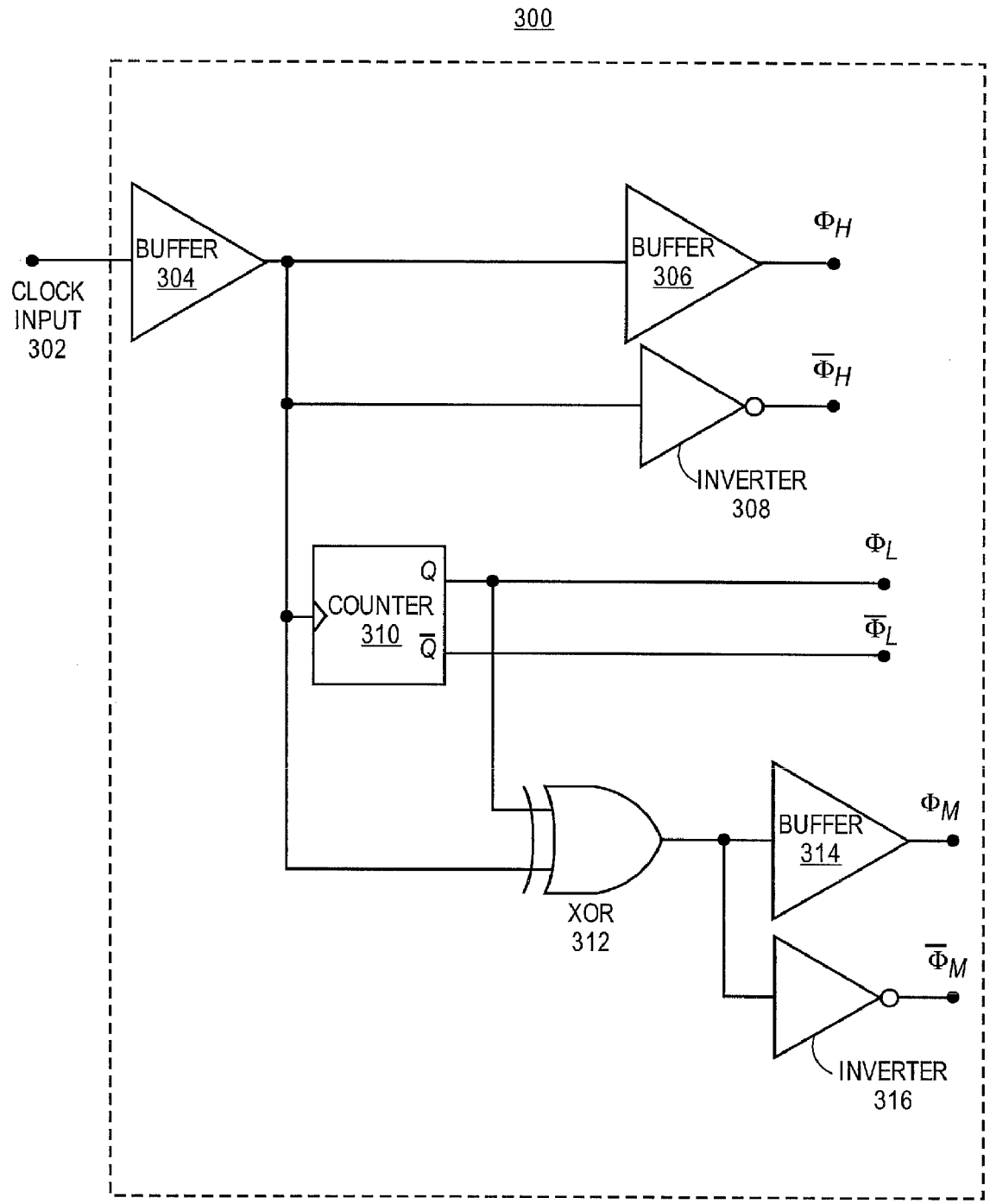
FIG. 3 is a schematic diagram illustrating a clock generation circuit consistent with embodiments of the present disclosure.

FIG. 3 is a schematic diagram illustrating an exemplary clock circuit 300 for generating clock signals for DCA 100. As shown, circuit 300 comprises an input clock signal 302, an input buffer 304, $\Phi_H$ buffer 306, $\Phi_H$ inverter 308, a counter 310, XOR logic 312, $\Phi_M$ buffer 314, and $\Phi_M$ inverter 316.

Circuit 300 converts input clock signal 302 into the three modulation clocks $\Phi_M$ 116, $\Phi_L$ 118, and $\Phi_H$ 120 and their complementary clocks utilized by DCA 100. Circuit 300 buffers clock input 302 in buffer 304 before passing the clock signal to other components. As shown, clock input 302 may be directly output as $\Phi_H$. As such, buffer 304 may coupled to $\Phi_H$ buffer 306. To create the complementary signal $\overline{\Phi}_H$, buffer 304 may be coupled to inverter 308 in order to create the inverse clock.

To create $\Phi_L$, clock input 302 may be passed to counter 310. As such, buffer 304 may be coupled to counter 310. Counter 310 accepts clock input 302 and steps the frequency down to a lower frequency. Counter 310 also generates complementary clock $\overline{\Phi}_L$.

To create $\Phi_M$, circuit 300 combines $\Phi_L$ and $\Phi_H$ by an exclusive disjunction. As such, buffer 304 and the output of counter 310 may be coupled to XOR logic 312. Output of XOR 312 may be coupled to $\Phi_M$ buffer 314. To create the complementary signal $\overline{\Phi}_M$, output of XOR 312 may be coupled to inverter 316 in order to create the inverse clock.

Figure 4:
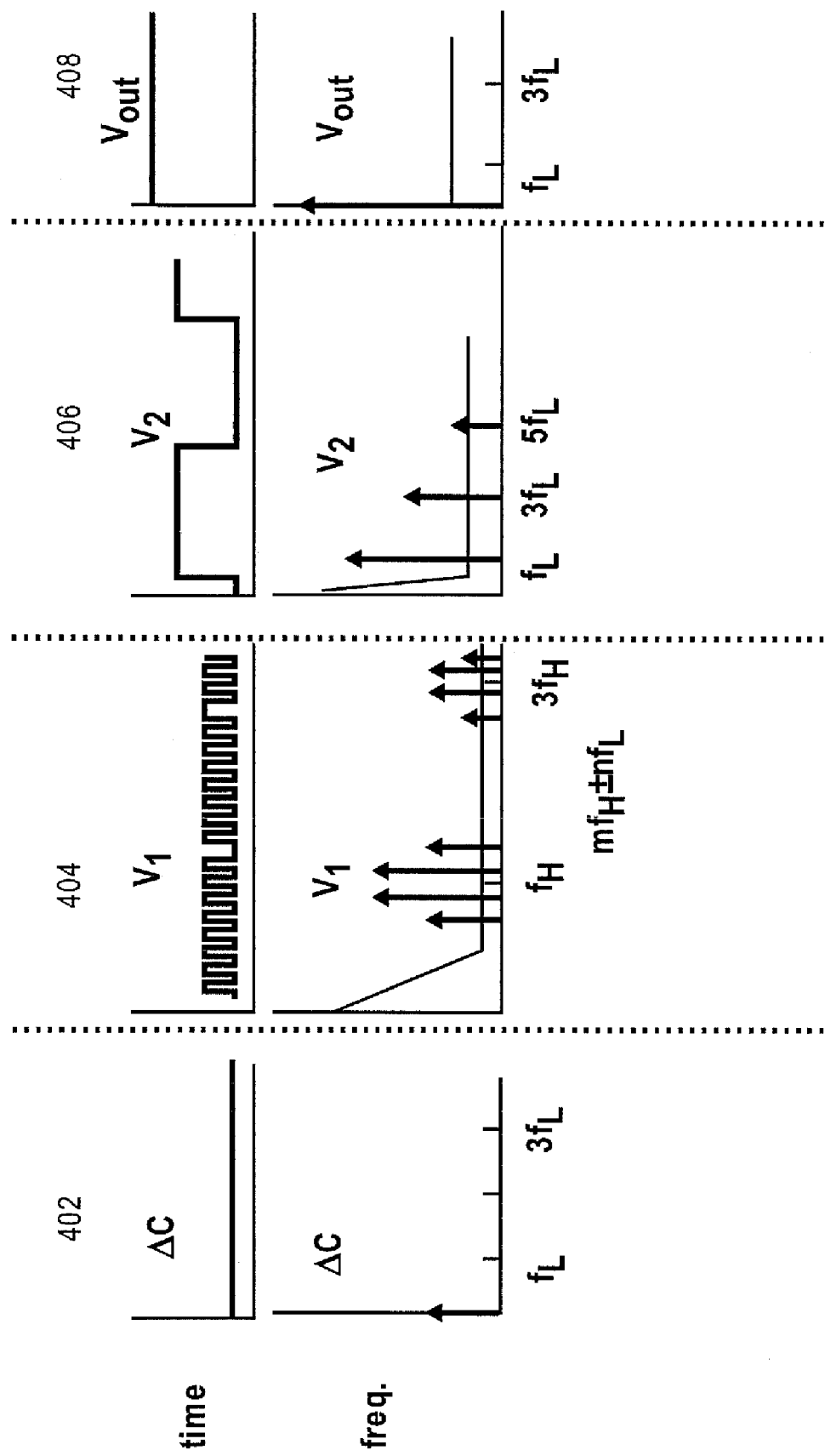
FIG. 4 is a diagram illustrating exemplary operation of the DCA consistent with embodiments of the present disclosure.

As mentioned above, by utilizing two amplification stages with dual choppers, noise may be removed from an amplifier circuit while maintaining low power dissipation and good gain accuracy. FIG. 4 are graphs illustrating the operation of DCA 100. The operation of DCA 100 is illustrated for capacitive sensing in the both frequency domain and time domain for a sensed DC signal.

Panel 402 illustrates the sensed capacitive signal in both the frequency and time domain. DCA 100 modulates the sensed signal by the mixed modulation clock $\Phi_M$. As shown in panel 404, the signal is double-modulated to frequencies $mf_H \pm nf_L$ (m and n are odd numbers). Since $f_H>>f_L$, the signal frequency components concentrate around frequencies $mf_H$ and with power decreasing with $$\frac{1}{m^2}.$$

DCA 100 then amplifies the double modulated signal and demodulates the signal with $\Phi_H$ in HFCA 104. As shown in panel 406, after demodulation with $\Phi_H$ in HFCA 104 and low-pass filtering by LPF1 108 to remove frequency components at $f_H$ and its harmonics, the signal is converted back to be modulated by $\Phi_L$, with frequency components at $nf_L$ with power proportional to $$\frac{1}{n^2}$$

(n is an odd number).

DCA 100 then amplifies and demodulates the signal in LFCA 106, which operates as a conventional chopper amplifier with $\Phi_L$ as the chopping clock. After demodulation by $\Phi_L$ in LFCA 106 and filtering by LPF2 110, the amplified signal may be output from output 112. When LPF1 108 is included in DCA 110, the offset and 1/f noise of amplifier 122 is modulated by $\Phi_H$ and low-pass filtered out by LPF1 108. When $f_H \geq 100 f_L$ and LPF1 108 is omitted from DCA 110, the offset and 1/f noise of amplifier 122 is double-modulated by $\Phi_H$ and $\Phi_L$ and finally low-pass filtered out by LPF2 110. The offset and 1/f noise of amplifier 128 is modulated by $\Phi_L$ and low-pass filtered out by LPF2 110. Therefore, as shown in panel 408, DCA 100 accepts a sensed signal and amplifies the signal without introducing much electronic noise. Furthermore, since a major part of gain may be provided by LFCA 106 at low-frequency modulation clock $\Phi_L$, power dissipation of DCA 100 may be greatly reduced, compared with conventional chopper amplifier with the high-frequency chopping clock $\Phi_H$.

As mentioned above, the DCA may be utilized as a low-power, high-performance readout circuit in capacitive sensing devices having small sensing capacitance and low transducer sensitivity, such as micro-machined accelerometers or gyroscopes. With different MEMS technologies and processes, the parasitic capacitance at the sensing nodes in capacitive sensors may vary in a wide range, compared with the sensing capacitance. The DCA may be configured as a readout circuit for capacitive sensors with either large or small parasitic capacitances at the sensing nodes.

Figure 5:
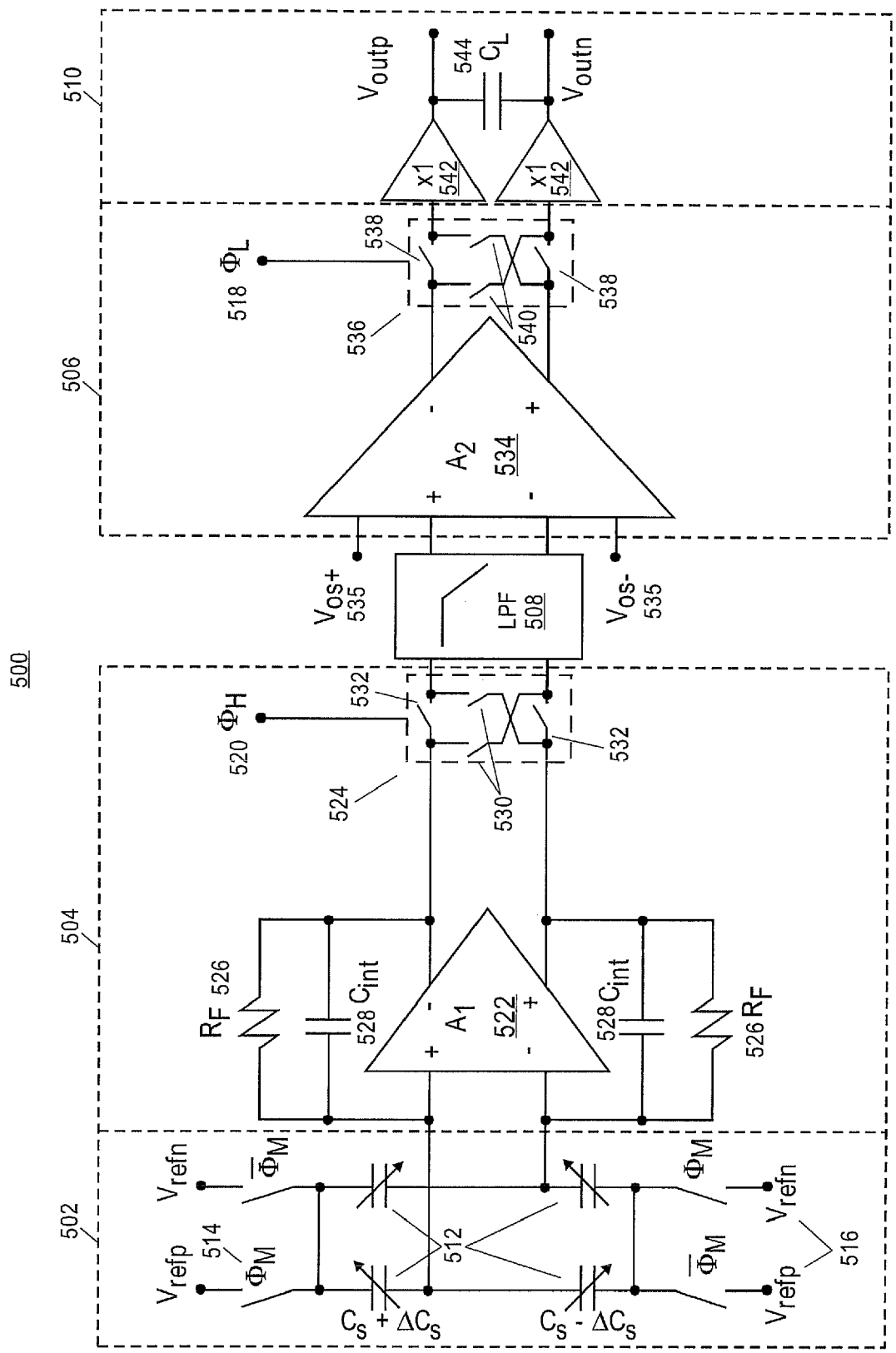
FIG. 5 is a schematic diagram illustrating a DCA as readout circuit for capacitive sensors with large parasitic capacitance at the sensing nodes consistent with embodiments of the present disclosure.

FIG. 5 is a schematic diagram illustrating a DCA 500 configured as a readout circuit for capacitive sensors with large parasitic capacitance at the sensing nodes. To make signal gain insensitive to the large parasitic capacitance at the sensing nodes, DCA 500 utilizes a closed-loop configuration for the first amplification stage. It should be readily apparent to those of ordinary skill in the art that DCA 500 illustrated in FIG. 5 represents a generalized schematic illustration and that other components may be added or existing components may be removed or modified.

As illustrated in FIG. 5, DCA 500 includes an input 502, a high-frequency, chopped amplification stage (HFCA) 504, a low-frequency, chopped amplification stage (LFCA) 506, a low pass filter (LPF) 508, and an output 510. DCA 100 may be configured such that input 502, HFCA 504, LFCA 506, LPF 508, and output 510 are coupled in series.

Input 502 may be a capacitive bridge for generating a capacitive difference in response to the stimulus to be sensed. In such an example, input 502 may be formed by mechanical sensing capacitor pairs 512 coupled in parallel. The capacitive bridge generates a voltage signal whose amplitude is proportional to the relative capacitance change $\Delta C_s/C_s$, where $\Delta C_s$ is the capacitance change and $C_s$ is the nominal sensing capacitance.

To reduce noise, input 502 may be driven by a modulation clock, $\Phi_M$ 514. Modulation clock $\Phi_M$ 514 may be coupled to both sides of the capacitive bridge. In this configuration, one side of the capacitive bridge is driven by $\Phi_M$ and one side is driven by a complementary clock, $\overline{\Phi}_M$, which is the inverse of $\Phi_M$. Additionally, the amplitude of $\Phi_M$ 514 may be controlled by DC reference voltages 516, $V_{refp}$ and $V_{refn}$.

According to embodiments of the disclosure, DCA 500 utilizes two fundamental chopping clocks, a low frequency chopping clock $\Phi_L$ 518 and a high frequency chopping clock $\Phi_H$ 520. The mixed modulation clock $\Phi_M$ 514 is generated by an exclusive disjunction ("exclusive OR" or "XOR") of $\Phi_L$ 518 and $\Phi_H$ 520. The frequencies of $\Phi_L$ 518 and $\Phi_H$ 520, $f_L$ and $f_H$ respectively, may be determined by the bandwidth (BW) of the signal from input 502 and the flicker noise corner of amplifier 522, respectively. $f_L$ and $f_H$ are required by the relationship BW$<<f_L<<f_H$, which are the typical situations for micro-machined capacitive sensors. For instance, MEMS accelerometers may have acceleration signals with a BW of a few kHz, and with $f_L$ being about a few tens of kHz and $f_H$ being about several hundred kHz to several MHz.

After converting the sensed capacitance to a double-modulated voltage signal, DCA 500 amplifies the voltage signal in two stages. DCA 500 may include HFCA 504 and LFCA 506 to amplify the signal modulated at $\Phi_M$ 514. As shown, HFCA 504 may be coupled to input 502 as a first amplification stage. HFCA 504 may comprise an amplifier 522 and a demodulator 524.

Amplifier 522 may be any type of high-gain, high-bandwidth amplifier capable of amplifying a signal from input 502. As shown in FIG. 5, each input of amplifier 522 may be coupled to a side of the capacitive bridge of input 502. Amplifier 522 is embedded in a closed-loop configuration to achieve an accurate gain, which is insensitive to the parasitic capacitance at the sensing nodes. As such, two parallel resistor 526 and capacitor 528 combinations may be coupled to both sides of amplifier 522. Resistors 526 are utilized to set the dc operation points of amplifier 522. Capacitors 528 are used to achieve accurate signal gain by providing a capacitive feedback. One skilled in the art will realize that the incremental resistance of resistors 526 should be much larger than the ac impedance of capacitors 528 to optimize the closed-loop configuration.

HFCA 504 may comprise a demodulator 524 with the high demodulation clock $\Phi_H$ 520. Demodulator 524 converts the signal amplified by 522 back to be modulated by the low-frequency clock $\Phi_L$ 518. As shown, $\Phi_H$ 520 may drive demodulator 524 at a frequency $f_H$. Demodulator 524 may be any type of demodulation circuit capable of being driven by a high frequency clock, such as a passive four-switch chopper or an active Gilbert mixer. For example, demodulator may comprise switching pairs 530 and 532 driven by $\Phi_H$ 520 at frequency $f_H$. In this configuration, switches 530 are driven by $\Phi_H$ and switches 532 are driven by a complementary clock, $\overline{\Phi}_H$, which is the inverse of $\Phi_H$.

After HFCA 504, DCA 500 may also include low-pass filter LPF 508 coupled to the output of HFCA 504. LPF 508 removes the offset and 1/f noise of amplifier 522, which are modulated to $f_H$ and its odd harmonics by demodulator 524. LPF 508 may be any type of continuous-time low-pass filter capable of removing high frequency components from the signal from HFCA 504. LPF 508 is required to have a cutoff frequency $f_{c1}$ such that $f_L<<f_{c1}<f_H$. In applications where $f_H \geq 100 f_L$, LPF 508 can be removed from DCA 500, because the leakage from offset and 1/f noise of amplifier 522 to the signal band is negligible.

After LPF 508, DCA 500 may include a second amplification stage LFCA 506 to further amplify the signal from the first amplification stage. As shown, LFCA 506 may be coupled to LPF 508. LFCA 506 may comprise an amplifier 534 and a demodulator 536.

Amplifier 534 may be any type of low-bandwidth amplifier capable of amplifying a signal from HFCA 504. For example, amplifier 534 may be a closed-loop, low-bandwidth amplifier optimized to provide accurate gain, consume low power, and maintain a large linear range. For instance, amplifier 534 may have a 3-db bandwidth much higher than $f_L$ of $\Phi_L$ 518. Amplifier 534 may also have auxiliary inputs, $V_{os+}$ and $V_{os-}$ 535 to tune or calibrate the sensor offset.

LFCA 506 also may comprise demodulator 536. Demodulator 536 converts the signal amplified by amplifier 534 back to base-band. As shown, $\Phi_L$ 518 may drive demodulator 536 at a frequency $f_L$. Demodulator 536 may be any type of demodulation circuit capable of being driven by a low frequency clock, such as a passive four-switch chopper or an active Gilbert mixer. For example, demodulator 536 may comprise switching pairs 538 and 540 driven by $\Phi_L$ 518 at frequency $f_L$. In this configuration, switches 538 are driven by $\Phi_L$ and switches 540 are driven by a complementary clock, $\overline{\Phi}_L$, which is the inverse of $\Phi_L$.

DCA 500 may also include output 510 to output the signal amplified by dual amplification stages and low-pass filter out the offset and 1/f noise of amplifier 534 modulated by demodulator 536. For example, if DCA 500 is included in a sensor, output 510 may output the amplified sensed voltage to other components of the sensor or to systems outside the sensor. Output 510 may include low-bandwidth unit-gain buffer pairs 542. Output 510 may also include a low-pass filtering capacitor 544 coupled between output lines. One skilled in the art will realize that the value for capacitor 544 is determined by the bandwidth requirement of the sensed signal.

Figure 6:
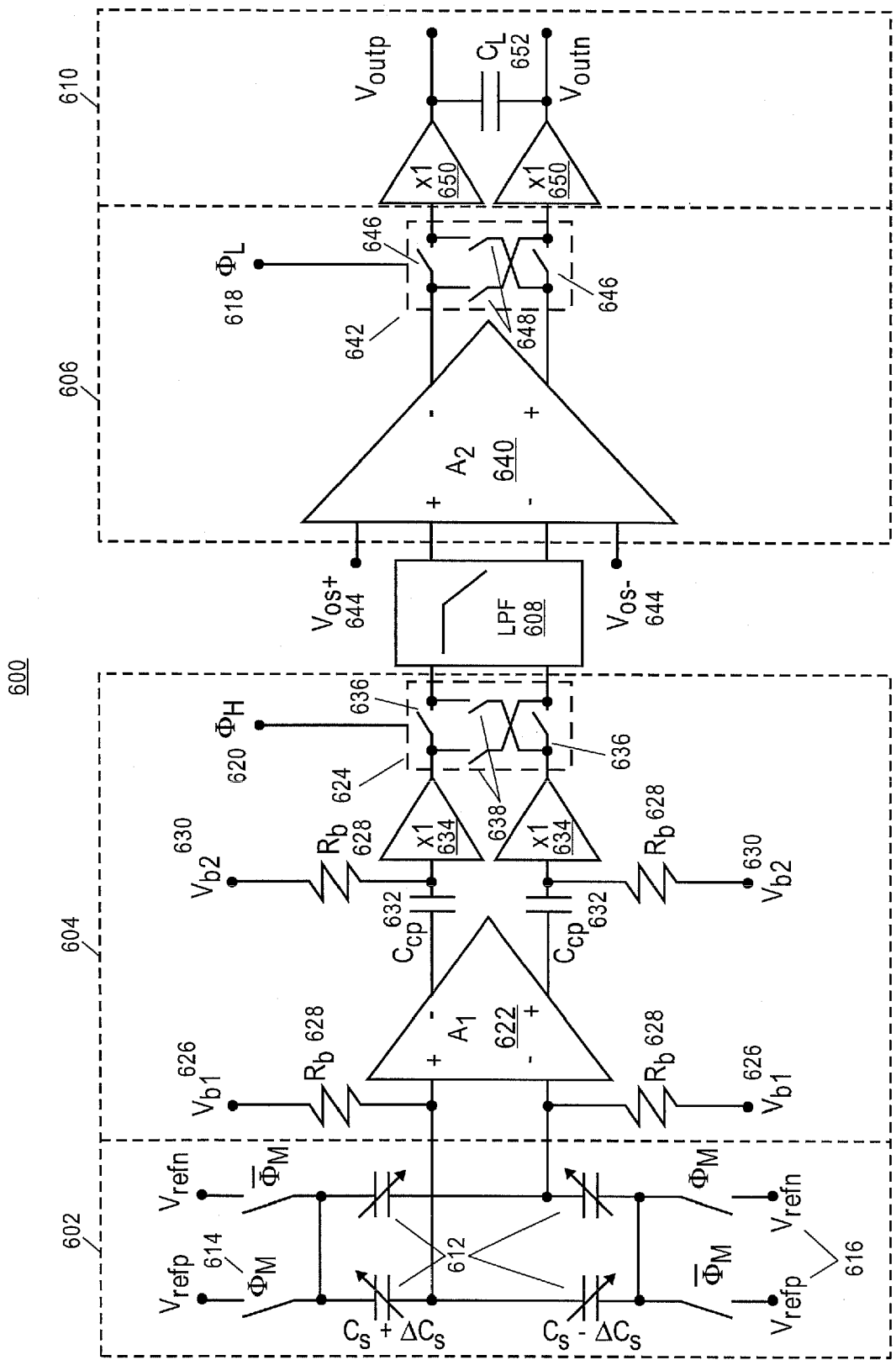
FIG. 6 is a schematic diagram illustrating a DCA as readout circuit for capacitive sensors with small parasitic capacitance at the sensing nodes consistent with embodiments of the present disclosure.

FIG. 6 is a schematic diagram illustrating a DCA 600 configured as a low-power readout circuit for monolithic capacitive sensors having small parasitic capacitance at the sensing nodes. To reduce power dissipation, DCA 600 utilizes an open-loop configuration in the first amplification stage, since signal attenuation by the parasitic capacitance at the sensing nodes is very small. It should be readily apparent to those of ordinary skill in the art that display DCA 600 illustrated in FIG. 6 represents a generalized schematic illustration and that other components may be added or existing components may be removed or modified.

As illustrated in FIG. 6, DCA 600 includes an input 602, a high-frequency, chopped amplification stage (HFCA) 604, a low-frequency, chopped amplification stage (LFCA) 606, a low pass filter (LPF) 608, and an output 610. DCA 600 may be configured such that input 602, HFCA 604, LFCA 606, LPF 608, and output 610 are coupled in series.

Input 602 may be a capacitive bridge for generating a capacitive difference in response to the stimulus to be sensed. In such an example, input 602 may be formed by mechanical sensing capacitor pairs 612 coupled in parallel. The capacitive bridge generates a voltage signal whose amplitude is proportional to the relative capacitance change $\Delta C_s/C_s$, where $\Delta C_s$ is the capacitance change and $C_s$ is the nominal sensing capacitance.

To reduce noise, input 602 may be driven by a modulation clock, $\Phi_M$ 614. Modulation clock $\Phi_M$ 614 may be coupled to both sides of the capacitive bridge. In this configuration, one side of the capacitive bridge is driven by $\Phi_M$ and one side is driven by a complementary clock, $\overline{\Phi}_M$, which is the inverse of $\Phi_M$. Additionally, the amplitude of $\Phi_M$ 614 may be controlled by DC reference voltages 616, $V_{refp}$ and $V_{refn}$.

According to embodiments of the disclosure, DCA 600 utilizes two fundamental chopping clocks, a low frequency chopping clock $\Phi_L$ 618 and a high frequency chopping clock $\Phi_H$ 620. The mixed modulation clock $\Phi_M$ 614 is generated by an exclusive disjunction ("exclusive OR" or "XOR") of $\Phi_L$ 618 and $\Phi_H$ 620. The frequencies of $\Phi_L$ 618 and $\Phi_H$ 620, $f_L$ and $f_H$ respectively, may be determined by the bandwidth (BW) of the signal from input 602 and the flicker noise corner of amplifier 622, respectively. The frequencies $f_L$ and $f_H$ are required by the relationship $BW \ll f_L \ll f_H$, which are the typical situations for micro-machined capacitive sensors. For instance, MEMS accelerometers may have acceleration signals with a BW of a few kHz, and with $f_L$ being about a few tens of kHz and $f_H$ being about several hundred kHz to several MHz.

After converting the sensed capacitance to a double-modulated voltage signal, DCA 600 amplifies the voltage signal in two stages. DCA 600 may include HFCA 604 and LFCA 606 to amplify the signal modulated at $\Phi_M$ 614. As shown, HFCA 604 may be coupled to input 602 as a first amplification stage. HFCA 604 may comprise an amplifier 622 and a demodulator 624.

Amplifier 622 may be an open-loop, low-gain, high-bandwidth amplifier capable of amplifying a signal from input 602. As shown in FIG. 6, each input of amplifier 622 may be coupled to a side of the capacitive bridge of input 602. Amplifier 622 is configured in an open-loop, low-gain configuration optimized to minimize noise and power dissipation. As such, voltage sources $V_{b1}$ 626 and resistors $R_b$ 628 may be coupled to the input of amplifier 622 to provide dc bias for the high-impedance sensing nodes. Voltage sources $V_{b2}$ 630, resistors $R_b$ 628 and capacitors 632 may be coupled to outputs of amplifier 622 to form an ac coupling path between amplifier 622 and unit-gain buffers 634, so that the offset of amplifier 622 can be effectively removed. One skilled in the art will realize that any types of electrical components and values for the components may be used for voltage sources 626 and 630, resistors 628, and capacitors 632 to optimize the open-loop configuration. Additionally, unit-gain buffers 634 may be coupled to outputs of amplifier 622.

HFCA 604 also may comprise a demodulator 624 with the high demodulation clock $\Phi_H$ 620. Demodulator 624 converts the signal amplified by 622 back to be modulated by the low-frequency clock $\Phi_L$ 618. As shown, $\Phi_H$ 620 may drive demodulator 624 at a frequency $f_H$. Demodulator 624 may be any type of demodulation circuit capable of being driven by a high frequency clock, such as a passive four-switch chopper or an active Gilbert mixer. For example, demodulator may comprise switching pairs 636 and 638 driven by $\Phi_H$ 620 at frequency $f_H$. In this configuration, switches 636 are driven by $\Phi_H$ and switches 638 are driven by a complementary clock, $\overline{\Phi}_H$, which is the inverse of $\Phi_H$.

After HFCA 604, DCA 600 may also include low-pass filter LPF 608 coupled to the output of HFCA 604. LPF 608 removes the offset and 1/f noise of amplifier 622 and unit-gain buffers 634, which are modulated to $f_H$ and its odd harmonics by demodulator 624. LPF 608 may be any type of continuous-time low-pass filter capable of removing high frequency components from the signal from HFCA 604. LPF 608 is required to have a cutoff frequency $f_{c1}$ such that $f_L \ll f_{c1} < f_H$. In applications where $f_H \geq 100 f_L$, LPF 608 can be removed from DCA 600, because the leakage from offset and 1/f noise of amplifier 622 and unit-gain buffers 634 to the signal band is negligible.

After LPF 608, DCA 600 may include a second amplification stage LFCA 606 to further amplify the signal from the first amplification stage. As shown, LFCA 606 may be coupled to LPF 608. LFCA 606 may comprise an amplifier 640 and a demodulator 642.

Amplifier 640 may be any type of low-bandwidth amplifier capable of amplifying a signal from HFCA 604. For example, amplifier 640 may be a closed-loop, low-bandwidth amplifier optimized to provide accurate gain, consume low power, and maintain a large linear range. For instance, amplifier 640 may have a 3-db bandwidth much higher than $f_L$ of $\Phi_L$ 618. Amplifier 640 may also have auxiliary inputs, $V_{os+}$ and $V_{os-}$ 644 to tune or calibrate the sensor offset.

LFCA 606 also may comprise demodulator 642. Demodulator 642 converts the signal amplified by amplifier 640 back to base-band. As shown, $\Phi_L$ 618 may drive demodulator 642 at a frequency $f_L$. Demodulator 642 may be any type of demodulation circuit capable of being driven by a low frequency clock, such as a passive four-switch chopper or an active Gilbert mixer. For example, demodulator 642 may comprise switching pairs 646 and 648 driven by $\Phi_L$ 618 at frequency $f_L$. In this configuration, switches 646 are driven by $\Phi_L$ and switches 648 are driven by a complementary clock, $\overline{\Phi}_L$, which is the inverse of $\Phi_L$.

DCA 600 may also include output 610 to output the signal amplified by dual amplification stages and low-pass filter out the offset and 1/f noise of amplifier 640 modulated by demodulator 642. For example, if DCA 600 is included in a sensor, output 610 may output the amplified sensed voltage to other components of the sensor or to systems outside the sensor. Output 610 may include low-bandwidth unit-gain buffer pairs 650. Output 610 may also include a low-pass filtering capacitor 652 coupled between output lines. One skilled in the art will realize that the value for capacitor 652 is determined by the bandwidth requirement of the sensed signal.

Figure 7:
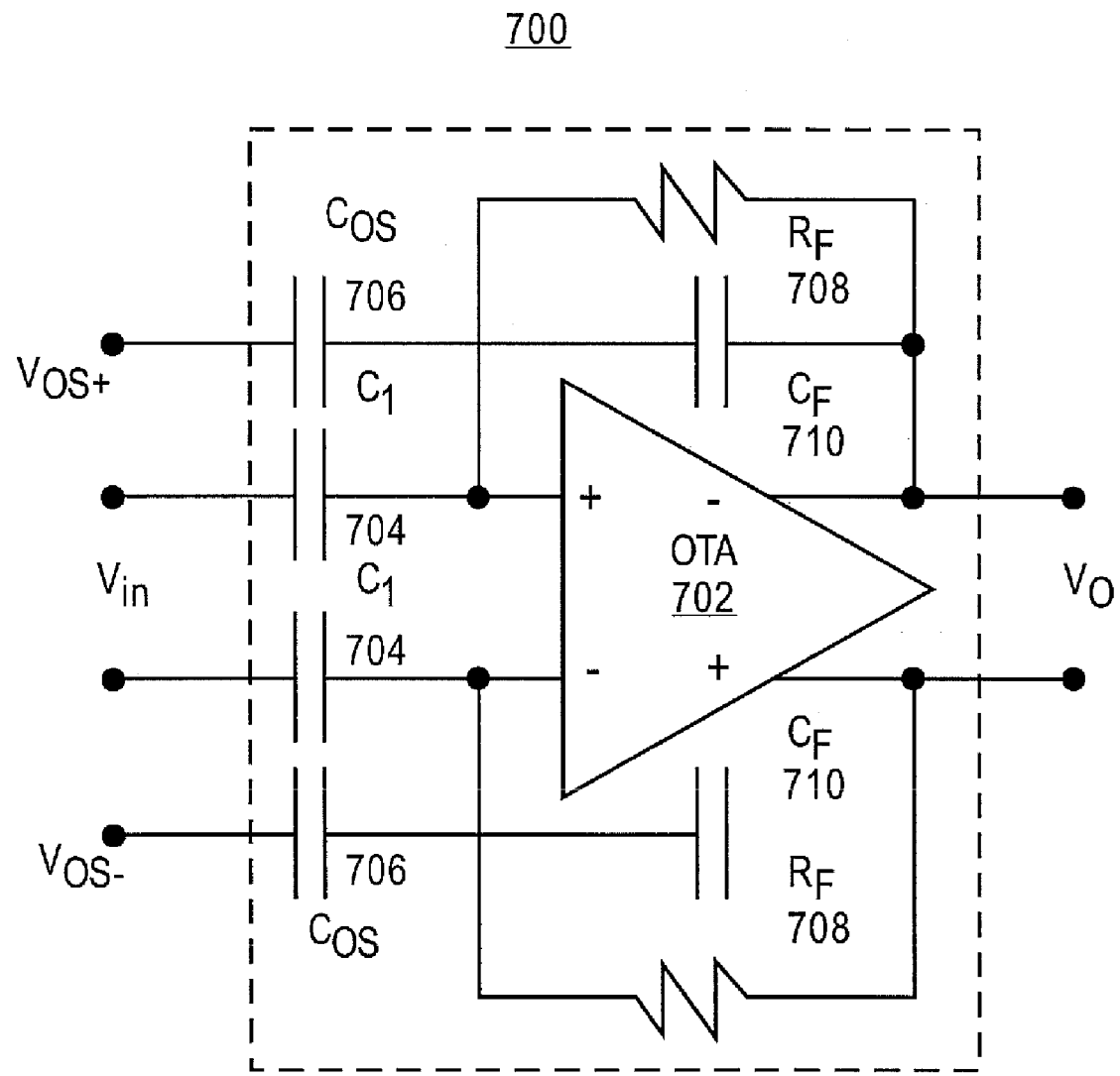
FIG. 7 is a schematic diagram illustrating a closed-loop circuit implementation consistent with embodiments of the present disclosure.

As mentioned above, the second amplification stage in DCA may include an amplifier that is configured in a closed-loop configuration. FIG. 7 is a schematic diagram illustrating an exemplary amplifier circuit 700 configured in a closed-loop configuration. Amplifier 700 may be utilized in DCA 100, 500, or 600.

As illustrated in FIG. 7, trans-capacitance amplifier (TCA) circuit 700 may include an operational trans-conductance amplifier (OTA) 702, input capacitor pair 704, offset calibration capacitor pair 706, dc feedback resistors 708, and feedback capacitors 710.

OTA 702 may be any type of high-gain amplifier capable of amplifying a voltage in a closed-loop configuration. For example, OTA 702 may be a fully-differential folded-cascode operational trans-conductance amplifier. The input voltage signal is coupled to inputs of OTA 702 via input capacitor pair 704. One skilled in the art will realize that capacitor pair 704 may be any type of capacitors with capacitive values optimized for TCA 700.

TCA 700 may be configured in a closed-loop configuration by connecting inputs and outputs of OTA 702 via feedback resistors 708 and feedback capacitors 710. As illustrated, feedback resistors 708 and feedback capacitors 710 may be coupled to inputs and outputs of OTA 702 in parallel. Resistors 708 are utilized to set the dc operation points of OTA 702. Capacitors 710 are used to achieve accurate signal gain by providing a capacitive feedback. One skilled in the art will realize that the incremental resistance of resistors 708 should be much larger than the ac impedance of capacitors 710 to optimize the closed-loop configuration.

Additionally, an offset voltage, $V_{os+}$ and $V_{os-}$ may be coupled to OTA 702 to tune or calibrate the sensor offset. As illustrated, $V_{os+}$ and $V_{os-}$ may be coupled to OTA 702 via offset capacitor pair 706. One skilled in the art will realize that capacitor pair 706 may be any type of capacitors with capacitive values optimized for TCA 700.

Other embodiments of the present teaching will be apparent to those skilled in the art from consideration of the specification and practice of the embodiments disclosed herein. It is intended that the specification and examples be considered as exemplary only, with a true scope and spirit of the invention being indicated by the following claims.

We claim:

1. A dual-chopper amplifier, comprising:
   an input modulated by a modulation clock, wherein the modulation clock is generated from a high-frequency clock and a low-frequency clock;
   a first amplification stage coupled to the input and demodulated by the high-frequency clock;
   a second amplification stage coupled to the first amplification stage and demodulated by the low-frequency clock; and
   an output coupled to the second amplification stage,
   wherein the modulation clock is an exclusive disjunction (XOR) of the high frequency clock and the low-frequency clock.

2. The amplifier of claim 1, further comprising:
   a first low pass filter coupled between the first amplification stage and the second amplification stage.

3. The amplifier of claim 2, further comprising:
   a second low pass filter coupled between the second amplification stage and the output.

4. The amplifier of claim 1, wherein the first amplification stage comprises:
   a high-bandwidth amplifier coupled to the input; and
   a high-frequency demodulator coupled to the high-bandwidth amplifier and configured to demodulate signals by the high-frequency clock.

5. The amplifier of claim 4, wherein the high-bandwidth amplifier is configured in an open-loop configuration.

6. The amplifier of claim 4, wherein the high-bandwidth amplifier is configured in a closed-loop configuration with capacitive feedback.

7. The amplifier of claim 4, wherein the high-frequency demodulator comprises a passive pair of four-switch chopper configured to demodulate signals by the high-frequency clock.

8. The amplifier of claim 1, wherein the second amplification stage comprises:
   a low-bandwidth amplifier coupled to the first amplification stage; and
   a low-frequency demodulator coupled to the low-bandwidth amplifier and configured to demodulate signals by the low-frequency clock.

9. The amplifier of claim 8, wherein the low-bandwidth amplifier is configured in a closed-loop configuration as a trans-capacitance amplifier.

10. The amplifier of claim 8, wherein the low-bandwidth amplifier comprises a folded-cascode operational trans-conductance amplifier.

11. The amplifier of claim 8, wherein the low-frequency demodulator comprises a passive four-switch chopper configured to demodulate signals by the low-frequency clock.

12. The amplifier of claim 1, further comprising:
   a clock circuit coupled to the input, first amplification stage, and second amplification stage, wherein the clock circuit generates the modulation clock, the high-frequency clock, and the low-frequency clock.

13. A readout circuit for capacitive sensors, comprising:
   a capacitive sensing input modulated by a modulation clock, wherein the modulation clock is generated from a high-frequency clock and a low-frequency clock;
   a dual stage amplifier, the dual stage amplifier comprising:
      a first amplification stage coupled to the input and demodulated by the high-frequency clock, and
      a second amplification stage coupled to the first modulated amplification stage and demodulated by the low-frequency clock; and
   an output coupled to the dual stage amplifier,
   wherein the modulation clock is an exclusive disjunction (XOR) of the high-frequency clock and the low-frequency clock.

14. The readout circuit for capacitive sensors of claim 13, wherein the dual stage amplifier further comprises:

a first low pass filter coupled between the first amplification stage and the second amplification stage.

15. The readout circuit for capacitive sensors of claim 14, wherein the dual stage amplifier further comprises:

a second low pass filter coupled between the second amplification stage and the output.

16. The readout circuits for capacitive sensors of claim 13, wherein the capacitive sensor is an accelerometer, a gyroscope, or a microphone.

17. A method of amplifying a signal, comprising:

double-modulating a signal by a modulation clock, wherein the modulation clock is generated from a high-frequency clock and a low-frequency clock;

amplifying the double-modulated signal by a first amplification;

demodulating the first amplified signal by the high-frequency clock;

amplifying the demodulated signal by a second amplification; and demodulating the second amplified signal by the low-frequency clock, wherein the modulation clock is an exclusive disjunction (XOR) of the high-frequency clock and the low-frequency clock.

18. The method of claim 17, further comprising filtering the demodulated signal to remove high-frequency components after demodulating the signal by the high-frequency clock and prior to amplifying the signal by the second amplification.

19. The method of claim 17, further comprising filtering the second amplified signal to remove high-frequency components after demodulating the signal by the low-frequency clock.

20. The method of claim 17, further comprising generating the modulation clock, the high-frequency clock, and the low-frequency clock.

\* \* \* \* \*